United States Patent [19]

Kamerman et al.

[11] Patent Number: 5,515,239
[45] Date of Patent: May 7, 1996

[54] STACKABLE MODULAR STORAGE TOWER

[75] Inventors: Joel B. Kamerman, Lake Oswego; Michael A. Mihalik, Beaverton; Kim S. Porter, Portland, all of Oreg.

[73] Assignee: Quantum Corporation, Milpitas, Calif.

[21] Appl. No.: 198,630

[22] Filed: Feb. 18, 1994

[51] Int. Cl.$^6$ .............................. H05K 7/10; H05K 7/14; G06F 1/16
[52] U.S. Cl. .................. 361/727; 361/724; 361/726; 361/685; 206/509; 206/512; 220/23.2
[58] Field of Search ...................... 206/509, 511, 206/512; 220/23.2, 23.4, 23.6; 312/111, 223.2, 265.6, 107, 333, 334.22, 334.27, 334.31, 334.4; 439/717, 712, 715, 64, 709, 695, 701, 357, 350, 498, 718, 521, 377, 372, 361, 368, 928, 928.1; 361/685, 724–727

[56] References Cited

U.S. PATENT DOCUMENTS

| | | |
|---|---|---|
| D. 311,737 | 10/1990 | Westwood et al. . |
| 4,530,066 | 7/1985 | Ohwaki et al. . |
| 4,682,833 | 7/1987 | Ferchau et al. . |
| 4,833,554 | 5/1989 | Dalziel et al. . |
| 4,858,070 | 8/1989 | Buron et al. ................. 361/725 X |
| 4,941,841 | 7/1990 | Darden et al. . |
| 5,065,262 | 11/1991 | Blackborow et al. . |

OTHER PUBLICATIONS

Advertisement for "SCSI Power Tower" in *Microtimes*, Dec. 1, 1993, p. 28.
Advertisement for "105MB Syquest Smartstack" in *Macworld* vol. 10, No. 9, Sep. 1993, p. 6.

Primary Examiner—Michael W. Phillips
Attorney, Agent, or Firm—Rives Stoel

[57] ABSTRACT

A storage column structure includes multiple storage column elements that interlock together in a vertical stack to form a compact, unitary tower assembly. A power supply module is positioned as a base unit to provide stability for the tower assembly. Each of the remaining storage column elements is adapted to receive and hold a removable modular storage device, such as a disk drive mechanism. Storage column elements are electrically interconnected in the stack to provide for the storage modules held by the storage column elements electrical power and connection to preferably a SCSI bus. The storage column elements are secured together by manually turnable fasteners provided in each storage column element. With the exception of the base unit, each of the storage column elements includes a floor that supports a removable storage device module; therefore, a storage device can be inserted or removed without affecting the structural integrity of the assembly. The electrical connectors providing access to the SCSI bus are placed near the floors of the storage column elements to permit the use of a single storage column element to hold any one of a number of storage device modules of different heights.

23 Claims, 9 Drawing Sheets

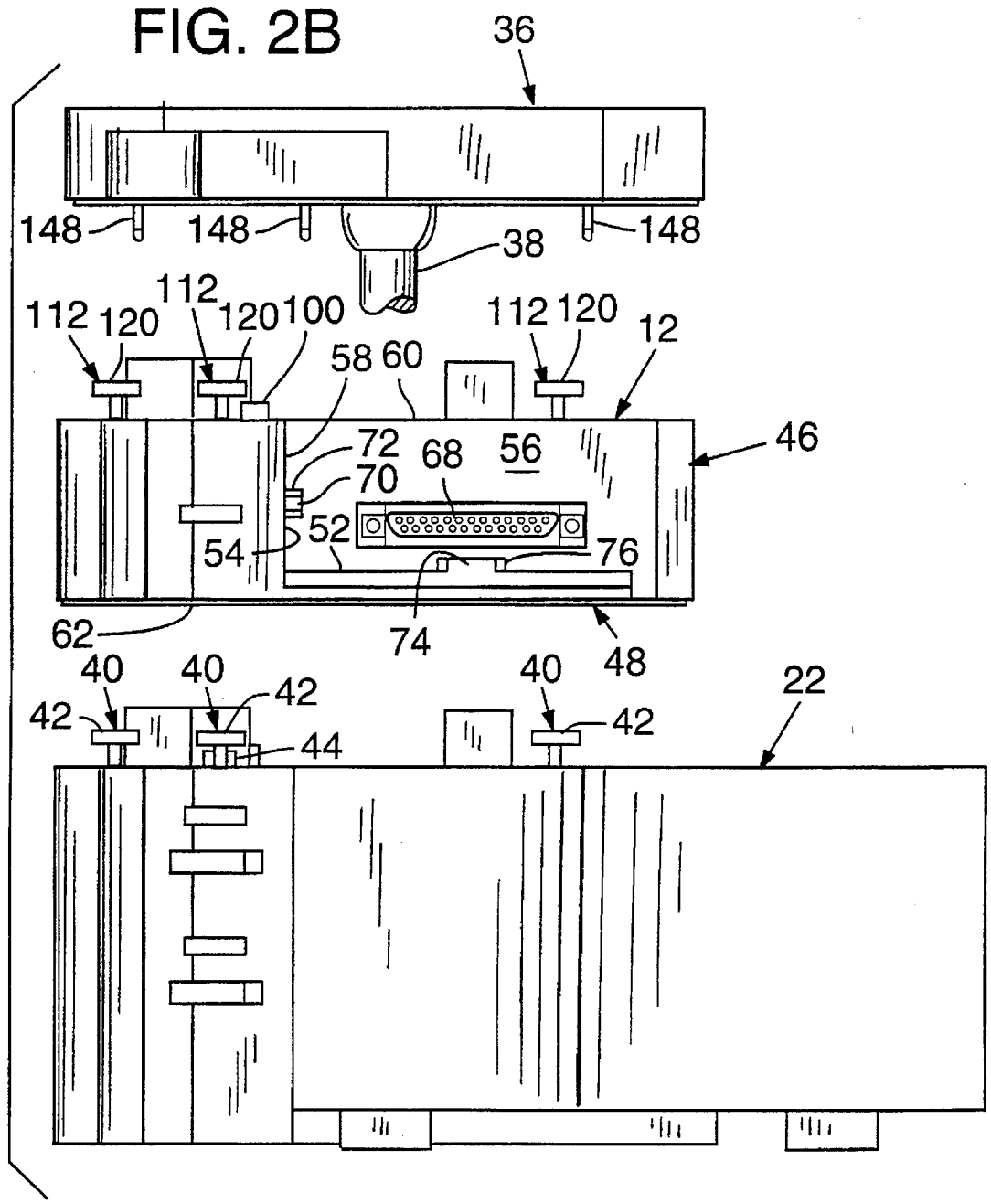

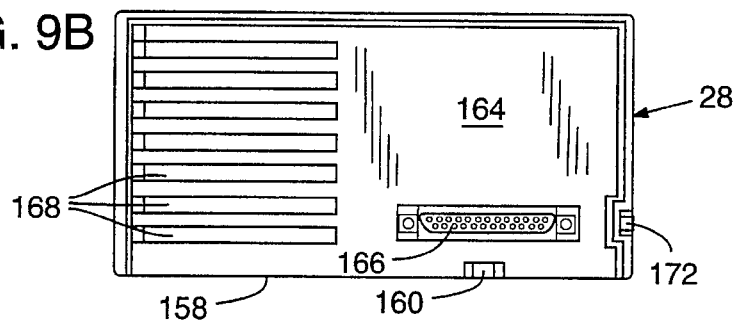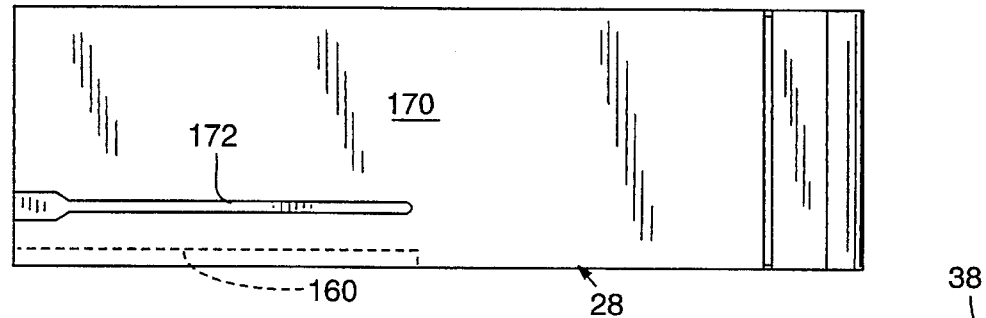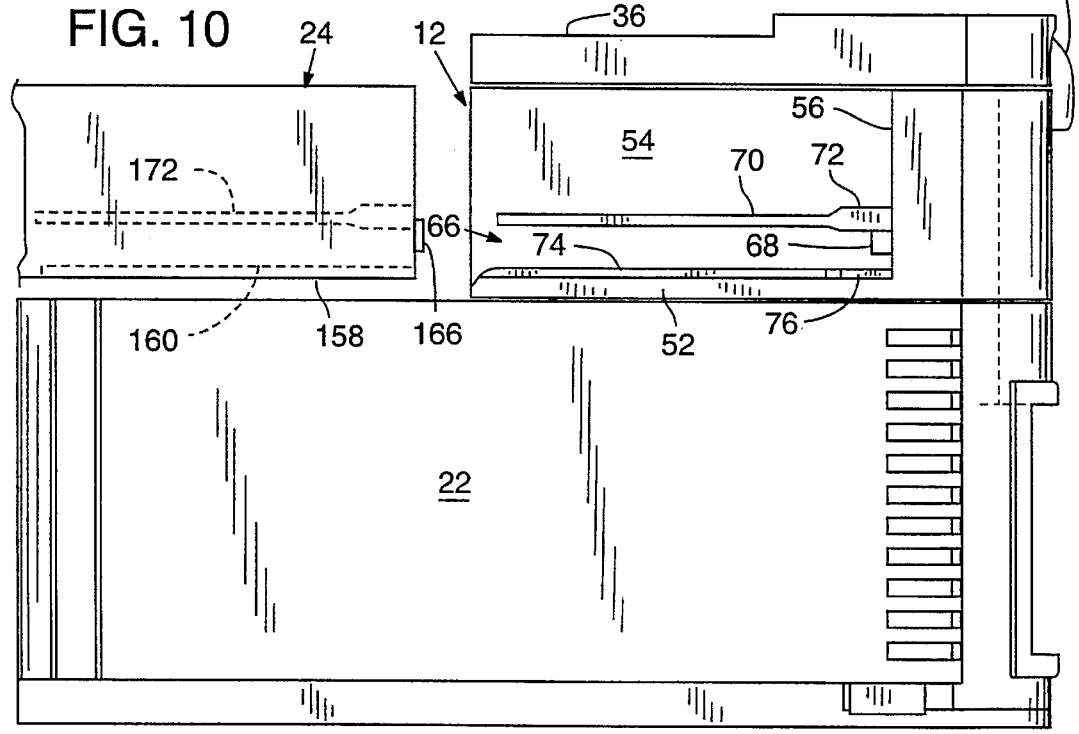

STACKABLE MODULAR STORAGE TOWER

TECHNICAL FIELD

The present invention relates to expandable electrical signal processing systems and, in particular, to a storage column structure including multiple storage column elements that interlock together in a stack to form a unitary tower assembly that receives and electrically interconnects removable storage modules of different types and sizes.

BACKGROUND OF THE INVENTION

Personal computers have internal hard disk drives and are capable of connection to peripheral mass storage media. For example, the Macintosh® computer manufactured by Apple® Computer, Inc. in Cupertino, Calif., is capable of functioning in cooperation with as many as six peripheral storage media connected in a small computer system interface (SCSI) bus chain. The storage media include hard disk, magnetic tape, magneto-optical, SyQuest™, and DAT drive modules. These media are typically packaged as cartridge-shaped modules. Because there are potentially seven peripherals available for connection to a SCSI bus, several storage module assembly configurations have been attempted to reduce the physical space occupied by the peripheral devices and facilitate their use in accomplishing a computational task.

One such assembly is the SmartStack™ drive system offered by Mirror Technologies of St. Paul, Minn. The SmartStack™ system can accommodate seven SmartModule™ drive modules in a vertical stack on top of a SmartSource™ power base. These modules can include the SyQuest™ 105MB drive, 127MB-1.2GB hard drive, optical drive, and DAT drive modules. Each SmartModule™ has matable complementary electrical connectors on its respective upper and lower surfaces. To add peripheral storage capacity, a user removes a top cover from the stack and snaps the bottom connector of an additional SmartModule™ onto the top connector of the top SmartModule™ of the stack and replaces the top cover on the upper surface of the just added SmartModule™. There are no cables interconnecting the SmartModules™ and SmartSource™ power base in the stack.

The SmartStack™ system suffers from the disadvantage of requiring a user to disassemble the stack whenever the user wishes to rearrange the peripherals or remove one of them from the stack.

U.S. Pat. No. 4,682,833 of Ferchau et al. describes a storage system for an array of disk drives each of which is carried in a universal slidable carrier drawer that when closed is automatically electrically connected to a matable connector positioned within the storage system. The storage system includes a unitary cabinet that is partitioned to receive multiple pairs of the drawers positioned side-by-side and arranged in a vertical stack. Each drawer is adapted to receive a disk drive module that can be maintained by pulling out the drawer for access to or removal of the drive module.

U.S. Pat. No. 4,833,544 of Dalziel et al. describes a unitary storage system having a receptacle for each of two portable hard disk drive modules. Each receptacle includes a mechanism for transporting the disk drive module from a module load position to a module operating position and from the module operating position to a module unload position. Movement of the module between these positions is under machine control. The receptacles are arranged so that the modules fit into the system in a bookshelf-type arrangement.

The Ferchau et al. and Dalziel et al. systems are unexpandable unitary structures and, therefore, suffer from the disadvantage of occupying the same amount of space irrespective of the number of disk drives installed or in use.

U.S. Pat. No. 4,530,066 of Ohwaki et al. describes a personal computer that is capable of having its functional capabilities expanded. The computer includes a power section and a main signal processing section that are mechanically connected for relative sliding movements between closely adjacent positions and spread-apart positions. The spread-apart positions define a space between the power and main signal processing sections to accommodate at least one additional signal processing or handling section by which the functional capabilities of the personal computer are expanded. Such additional sections typically include at least one disk drive mechanism. Long screws extending through the housings for the power and signal processing sections rigidly secure them together in an assembly from which any one of the signal processing sections is not readily removable. Thus, a user must partly take apart the assembly to expand or decrease the functional capability of the personal computer.

SUMMARY OF THE INVENTION

An object of the invention is, therefore, to provide an expandable, compact structural assembly for holding modular mass storage devices.

Another object is to provide such an assembly that permits removal or replacement of the modular storage devices without disassembly of the structure.

A further object is to provide such an assembly that facilitates the use of modular storage devices of different sizes.

Still another object of the invention is to provide such an assembly in which the storage devices held by the structural assembly do not provide physical support for one another.

The present invention is a storage column structure that includes multiple storage column elements that interlock together in a vertical stack to form a compact, unitary tower assembly. A power supply module is positioned as a base unit to provide stability for the tower assembly. Each storage column element is adapted to receive and hold a removable modular storage device, such as a disk drive mechanism. Storage column elements are electrically interconnected in the stack to provide for the storage modules held by the storage column elements electrical power and connection to preferably a SCSI bus.

The storage column elements are secured together by manually turnable fasteners provided in each storage column element. The manually adjustable fasteners are preferably of elongated tubular design having a handle at one end and a slotted receptacle at the other end. The slotted receptacle is sized to receive the handle of another storage column element when the handle is turned to a locked position.

To securely interlock next adjacent upper and lower storage column elements in a stack, the receptacle of the upper storage column element set in the unlocked position receives the handle of the lower storage column element set in the locked position. Turning the handle of the upper storage column element to the locked position locks the handle of the lower storage column element within the receptacle of the upper storage column element and thereby secures the two storage column elements together.

With the exception of the base unit, each of the storage column elements includes a floor that supports a removable storage device module; therefore, a storage device can be inserted or removed without affecting the structural integrity of the assembly. The electrical connectors providing access to the SCSI bus are placed near the floors of the storage column elements to permit the use of a single storage column element to hold any one of a number of storage device modules of different heights. The number and sizes of storage column elements specify the height of the tower assembly, and the use of storage column elements facilitates removal and replacement of storage modules included in a stack of any given size.

Additional objects and advantages of the present invention will be apparent from the following detailed description of a preferred embodiment thereof, which proceeds with reference to the accompanying drawings.

BRIEF DESCRIPTION OF THE DRAWINGS

FIGS. 2A and 2B are respective isometric and frontal exploded views showing the spatial alignment of an embodiment of a tower assembly of the invention having a base unit, one storage column element, and a top cap.

FIGS. 9A, 9B, and 9C are respective bottom, rear, and side elevation views of a storage module of the type shown installed in the tower assembly of FIG. 1.

FIG. 10 shows the track-guide rail alignment required to insert a storage module into a column storage element of a short stack embodiment of the tower assembly of the invention.

DETAILED DESCRIPTION OF PREFERRED EMBODIMENT

Figure 1:
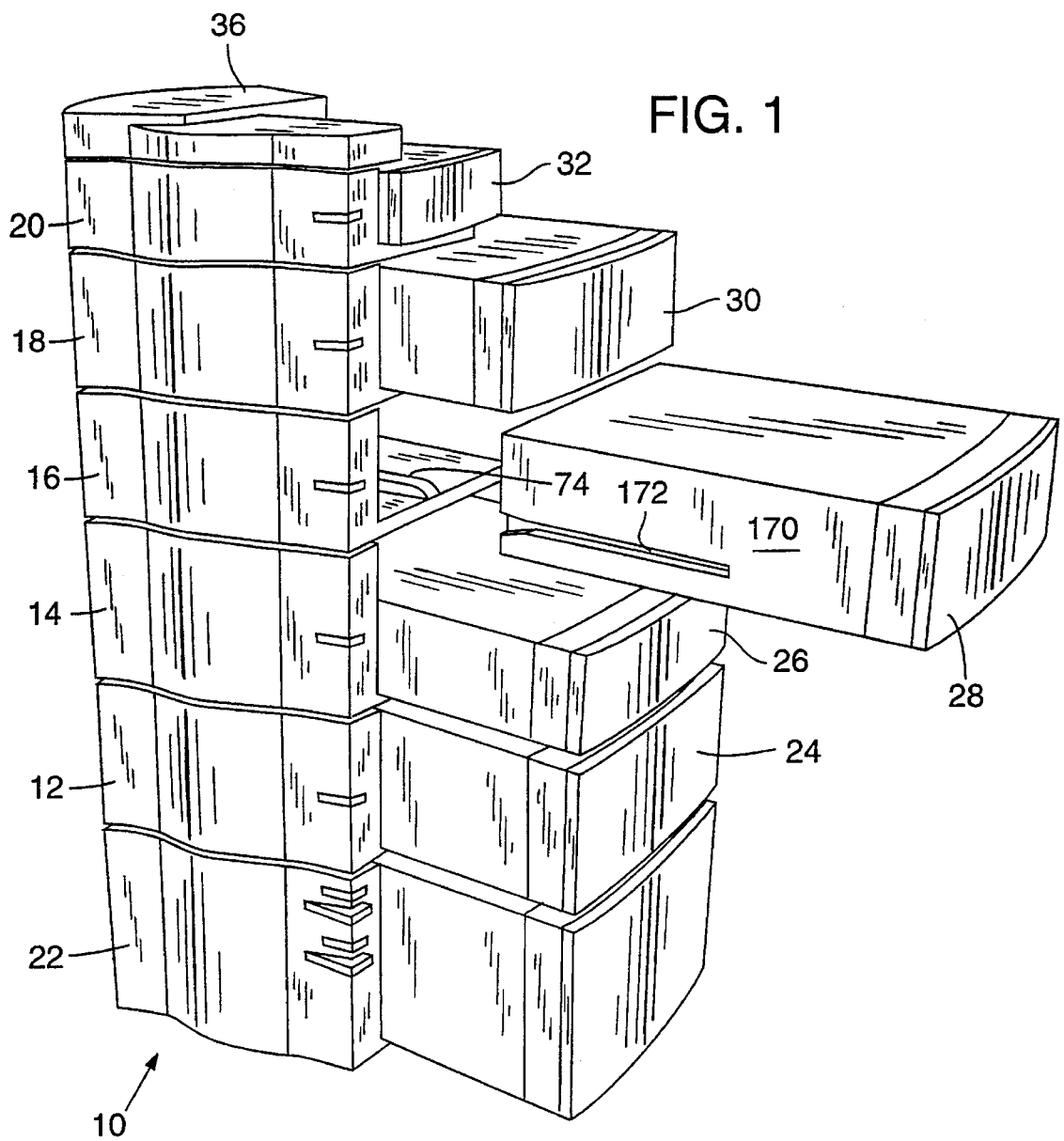
FIG. 1 is an isometric view of a stackable modular tower assembly of the invention with one storage module positioned out of but in proximity to its associated storage column element to demonstrate a capability to remove and replace a storage module without affecting the storage modules remaining in or the overall height of the tower assembly.

FIG. 1 shows a tower assembly 10 that includes five storage column elements 12, 14, 16, 18, and 20 vertically stacked on top of one another and supported by a power supply base unit 22. Storage column elements 12, 14, 16, 18, and 20 hold respective removable storage modules 24, 26, 28, 30, and 32. Each storage column element and its associated removable storage module is electrically connected by matable connectors. An electrical connection linkage such as a flat ribbon cable for a SCSI bus is housed and routed within tower assembly 10 from base unit 22, through storage column elements 12, 14, 16, 18, and 20, and to a D-type electrical connector 34 (FIG. 7) installed in a top cap 36 that covers the upper surface of column storage element 20 to electrically interconnect the storage modules. A connector cable 38 (FIG. 7) extending from the rear side of top cap 36 at the top of tower assembly 10 provides an information link for the storage modules and a computer (not shown).

Any of the storage modules may be removed without disturbing the other storage modules in the stack. Because a storage module may be removed from its associated storage column element (as indicated by storage module 28 shown removed from storage column element 16), the space occupied by tower assembly 10 need not change because its storage column elements may remain in place even though the number of storage modules in use may change. An electrical connector is positioned near the floor of each storage column element to allow it to receive a matable connector of and hold a storage module whose height is less than that of the storage column module (as indicated by storage module 26 in storage column element 14). The overall height of tower assembly 10 depends on the number of storage column elements in place.

Figure 2A:
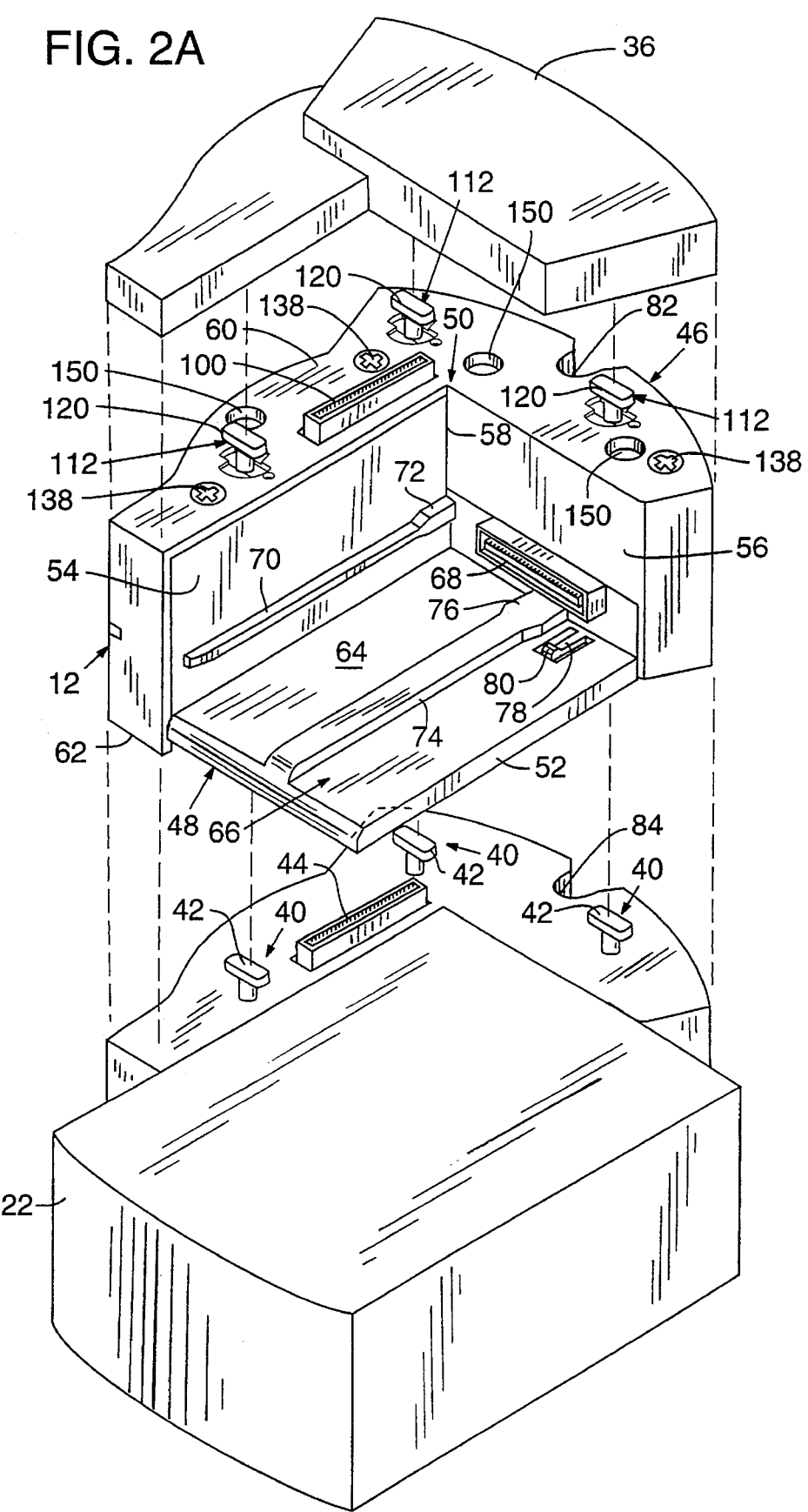

FIGS. 2A and 2B are exploded views of a short stack tower assembly 10 that includes only base unit 22, storage column element 12, and top cap 36. Base unit 22 is preferably a unitary structure that houses a power supply for the storage modules in the tower assembly and any peripheral device connected to the SCSI bus. Thus, there is no modular pull-out component of the type insertable in the storage column elements. Base unit 22 has three T-shaped handles 40 extending upwardly from and positioned in a predetermined spatial arrangement on the upper surface of base unit 22. T-shaped handles 40 have their "hat" sections 42 fixedly positioned to receive associated slotted receptacles of column element 12, as will be further described below. A D-type electrical connector 44 fitted into a slot in the upper surface of base unit 22 represents one end of the SCSI bus routed through tower assembly 10.

Figure 3:
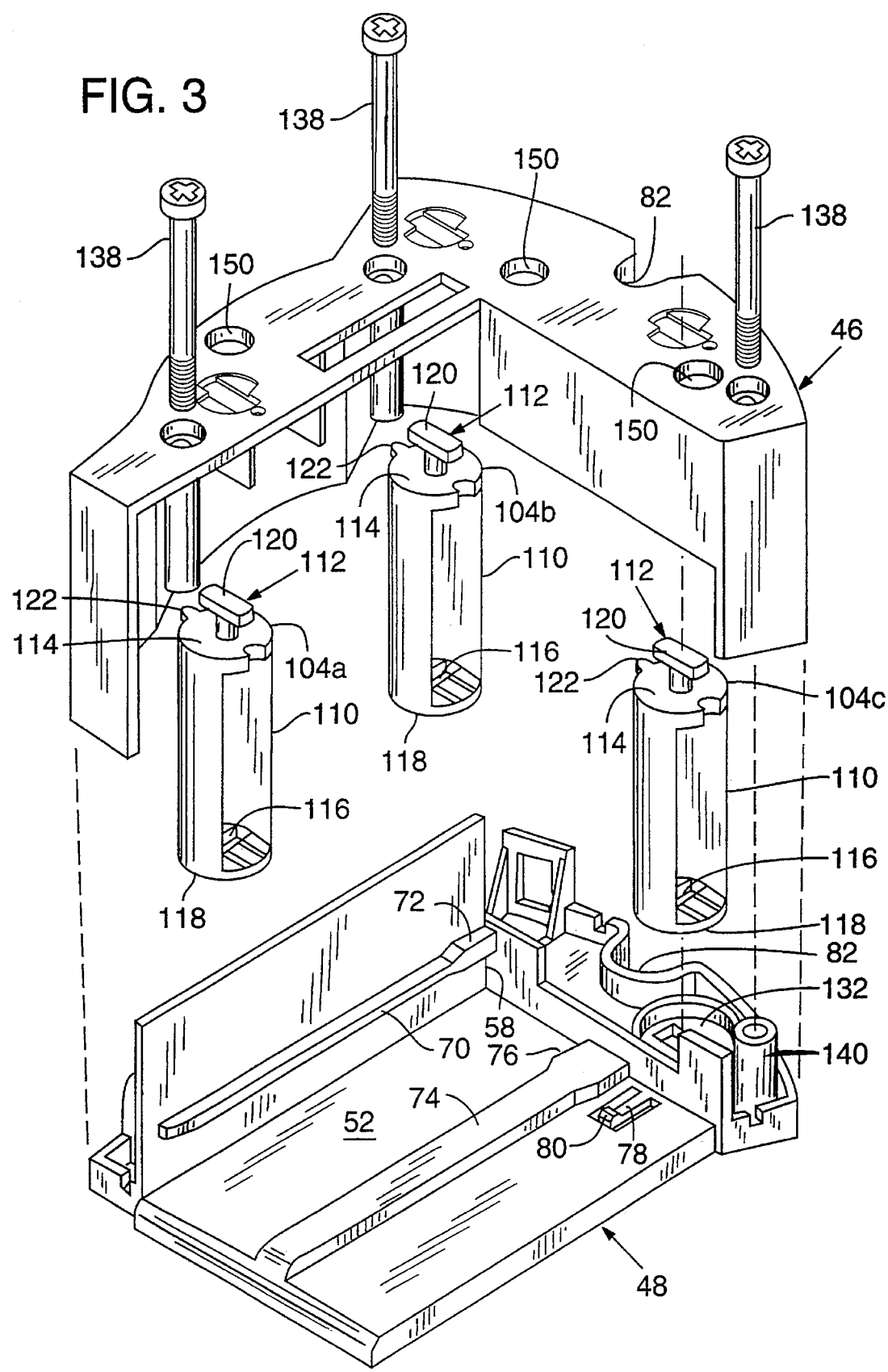
FIG. 3 is an enlarged, exploded view of a storage column element of the invention.
Figure 4:
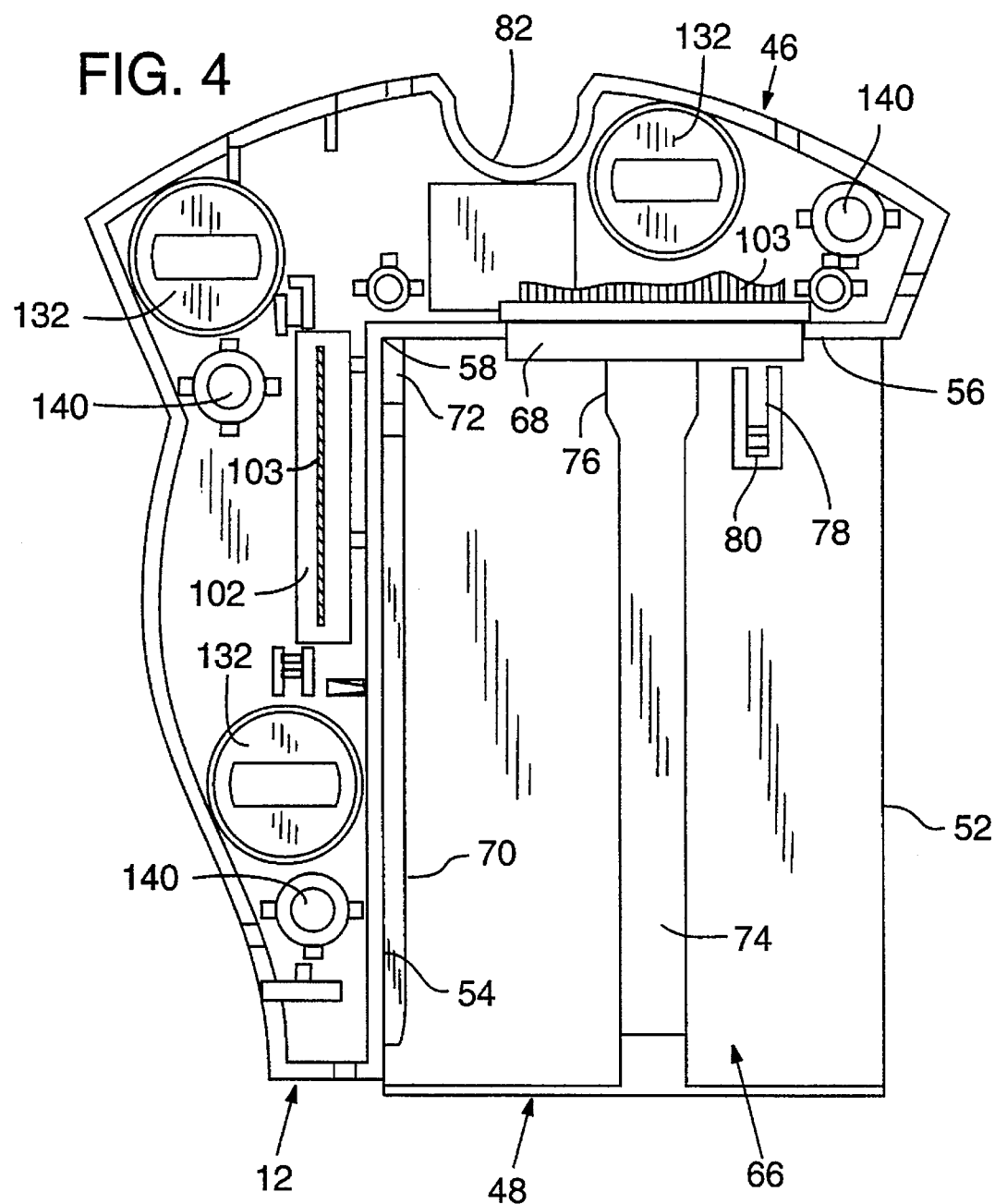
FIG. 4 is a plan view of the bottom shell portion of the storage column element of FIG. 3
Figure 5:
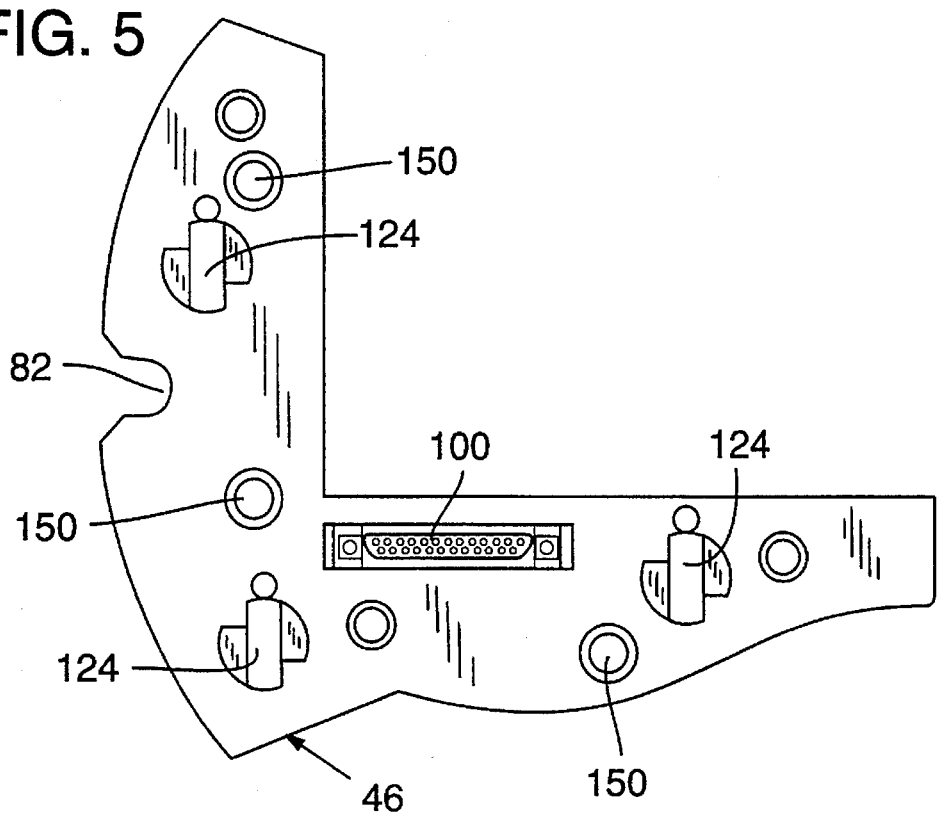
FIGS. 5 and 6 are plan views of the respective outside and inside surfaces of the top shell portion of the storage column element of FIG. 3.
Figure 6:
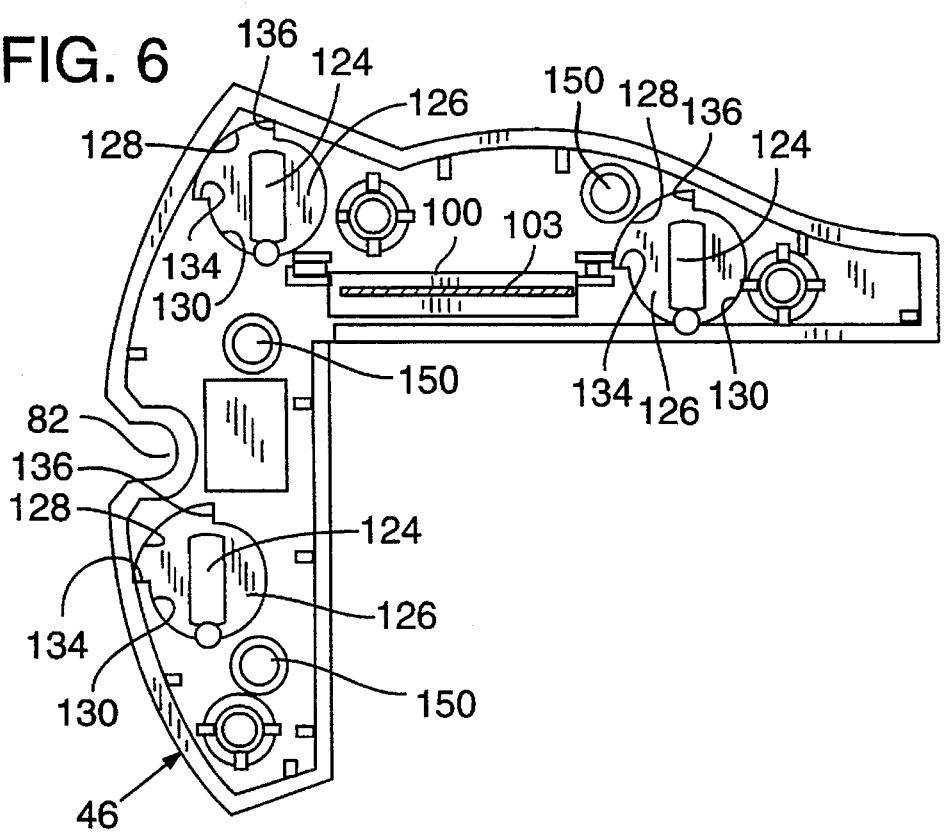

Storage column elements 12, 14, 16, 18, and 20 are preferably of the same structural design; therefore, for simplicity, the following description of the storage column element design details is directed only to storage column element 12. FIGS. 2A and 2B show storage column element 12 separate from tower assembly 10; FIG. 3 shows an exploded view of storage column element 12; and FIGS. 4–6 show different views of the components of storage column element 12.

With reference to FIGS. 2A, 2B, and 3–6, storage column element 12 includes an upper shell portion 46 and a lower shell portion 48 that when assembled form a right angle wall structure 50 that bounds two adjoining side margins of a rectangular floor 52. Wall structure 50 has a longer inner side surface 54 and a shorter inner side surface 56 that intersect to form an interior corner 58. Floor 52 and inner side surfaces 54 and 56 are integral parts of lower shell portion 48. The distance between an upper surface 60 and a lower surface 62 of storage column element 12 defines its height. Inner side surfaces 54 and 56 and an upper surface 64 of floor 52 define in storage column element 12 a storage module receptacle 66 having open top, side, and front sections. Inner side surface 56 functions as the rear wall of receptacle 66 and holds near upper surface 64 of floor 52 a D-type electrical connector 68 that is matable with a complementary connector of a storage module positioned in receptacle 66 and held by storage column element 12.

A first guide member 70 in the form of a rail protruding from and extending along the length of side surface 54 is positioned proximally to upper surface 64 of floor 52. Guide member 70 terminates in a graduated, single-step flared section 72 near interior corner 58. A second guide member 74 in the form of a rail protruding from and positioned generally centrally of upper surface 64 of floor 52 extends in a direction along the length of inner side surface 54 and terminates in a graduated single-step flared section 76 at rear wall 56. The width of guide member 74 is greater than that of guide member 70, and the width of flared section 76 is greater than that of flared section 72. Guide members 70 and 74 fit in corresponding complementary guide track recesses in a storage module to provide sufficient holding force to secure the storage module in place when it is installed in receptacle 66 of storage column element 12.

A locking tab 78 with a hooked end 80 project upwardly from an opening in floor 52 to fit into a depression in the bottom side of a storage module properly positioned in receptacle 66. Arcuate recesses 82 and 84 in storage column element 12 and base unit 22, respectively, provide a storage channel into which cable 38 extending from top cap 36 can fit much like a spinal cord for tower assembly 10.

Complementary matable D-type connectors 100 and 102 are fitted into the respective upper surface 60 and lower surface 62 of storage column element 12. Connector 100 mates with either connector 34 installed in top cap 36 (FIG. 7), if storage column element 12 is positioned at the top of the tower assembly, or with the bottom connector of the storage column element positioned adjacent upper surface 60, if storage column element 12 is medially positioned within the tower assembly. Connector 102 mates with either connector 44 installed in base unit 22, if storage column element 12 is positioned at the bottom of the tower assembly, or with the top connector of the storage column element positioned adjacent lower surface 62, if storage column element 12 is medially positioned within the tower assembly. D-type connectors 68, 100, and 102 are interconnected by a flat cable so that there is a direct electrical connection among each of their corresponding connector pin positions. The electrical connection of connectors 68, 100, and 102 includes a multiple parallel conductor flat electrical cable 103 configured to form an electrical series connection between connectors 100 and 102 and an electrical T connection for connectors 100 and 102 to connector 68.

Three similar, spaced-apart manually actuatable fasteners 104a, 104b, and 104c (collectively "fasteners 104") extend between upper surface 60 and lower surface 62 of storage column element 12. (Corresponding features of fasteners 104 are designated by common reference numerals.) Each of fasteners 104 has a partly open-sided tubular body 110 of cylindrical shape having a T-shaped handle 112 extending from one end cap 114 and a receptacle 116 positioned at the other end cap 118. T-shaped handle 112 extends from end cap 114, with the "hat" section 120 of the "T" constituting a turning handle. Receptacle 116 constitutes a slot in end cap 118 and is sized to receive a handle of the size of hat section 120 of handle 112 and hat section 42 of handle 40. In a preferred embodiment, T-shaped handles 40 and 112 are of identical construction with the exception that the former is not manually actuatable for rotation.

Each of fasteners 104 has on its body 110 and extending from end cap 114 a stop tab 122 that limits to one-quarter turn the rotational motion of handle 112 about the longitudinal axis of body 110 of the fastener when it is installed in storage column element 12. With particular reference to FIGS. 3 and 6, hat section 120 of handle 112 extends through a slot 124 in upper shell portion 46. End cap 114 rests against a generally circular depression 126 defined by two different radii. Stop tab 122 is positioned within a quarter-turn angular segment 128 of a larger radius, and the periphery of end cap 114 conformally fits within the remaining 270° angular segment 130 defined by a shorter radius of depression 126. With particular reference to FIGS. 3 and 4, end cap 118 rests in a circular depression 132 in lower shell portion 48.

Whenever a user turns handle 112, stop tab 122 angularly moves between an end surface 134 and an end surface 136 of quarter-turn angular segment 128. End surfaces 134 and 136 define respective locked and unlocked positions of handle 112 when lower surface 62 of storage column element 12 is placed onto the upper surface of base unit 22 for tower assembly 10.

Three screws 138 passing through bores in upper shell portion 46 fit into threaded mounting studs 140 in lower shell portion 48 to hold storage column element 12 together. The flat cable interconnecting connectors 68, 100, and 102 is omitted from FIG. 3 for purposes of clarity.

With particular reference to FIGS. 2A, 2B, and 3, whenever handles 112 of fasteners 104a, 104b, and 104c are in their unlocked positions such that receptacles 116 fit over and receive the corresponding spatially aligned handles 40 of base unit 22 on which storage column element 12 is placed, fasteners 104 properly seat onto the upper surface of base unit 22. (If storage column element 12 is placed onto the upper surface of a second storage column element, receptacles 116 fit over and receive the corresponding spatially aligned handles, and fasteners 104 properly seat onto the second storage column element previously locked in place in the tower assembly.)

Whenever handles 112 of fasteners 104a, 104b, and 104c are in their locked positions (which are shown in FIGS. 2A, 2B, and 3), handle 112 is positioned transversely of and is secured within slot 116. Storage column element 12 cannot receive top cap 36 (or support a second storage column element) unless all three fasteners are in their locked positions. This is so because, for each of fasteners 104, the long axis of hat section 120 of handle 112 is angularly displaced by 90° relative to the long axis of slot 116 and end cap 114 of handle 112.

Figure 7:
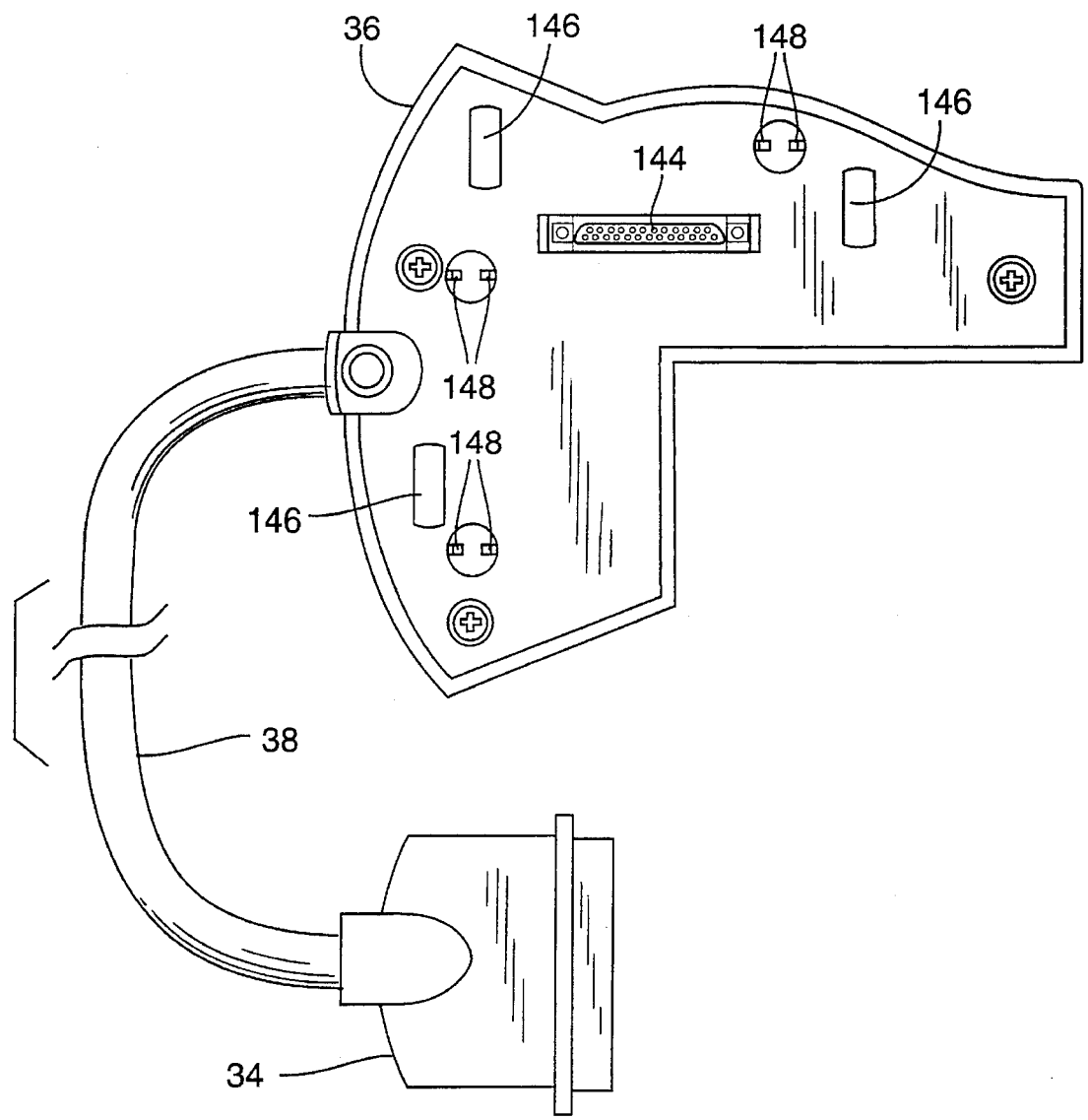
FIG. 7 is a plan view of the underside of the tower assembly top cap and the SCSI computer connection cable.

FIG. 7 shows the underside of top cap 36 together with cable 38 that terminates in a D-type connector 144 so that the wires in cable 38 connect the corresponding pins of connectors 144 and 34. Connector 34 is routed for connection to a computer (not shown). Top cap 36 has three slots 146 of the same size as, spatially aligned with, and oriented to receive hat sections 120 of T-shaped handles 112 of storage column element 12 when they are in their locked positions. Electrical connector 34 is of complementary shape and matable to connector 100 in upper surface 60 of storage column element 12. Attachment prongs 148 snap into corresponding spatially aligned holes 150 (FIGS. 2A, 3, 5, and 6) in upper surface 60 of storage column element 12.

Figure 8:
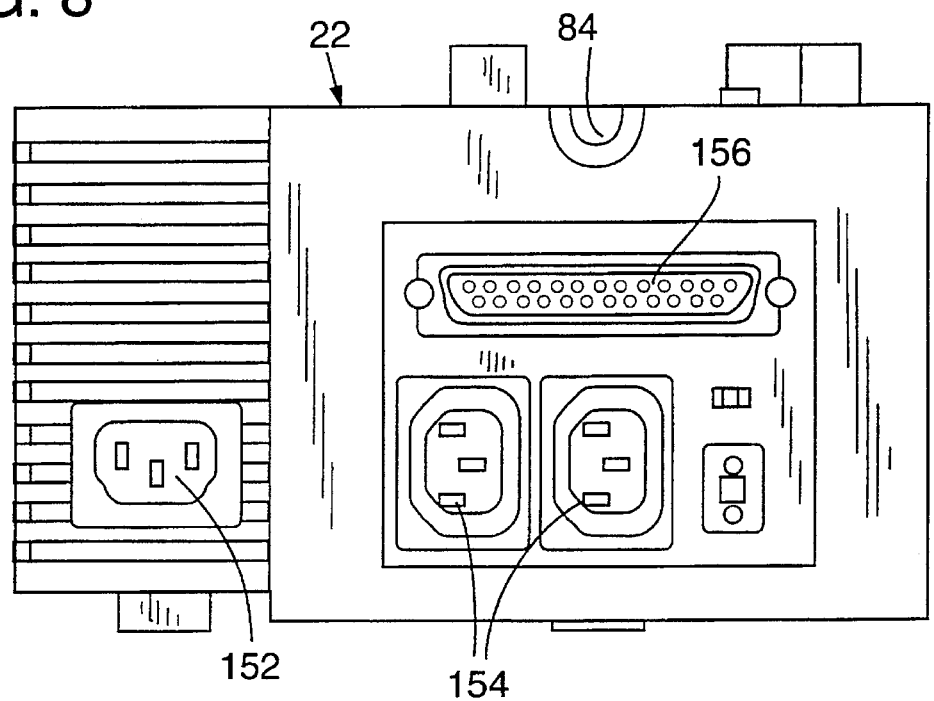
FIG. 8 is an enlarged, rear elevation view of the base unit of the tower assembly.

FIG. 8 shows the rear side of base unit 22. Base unit includes an AC line power cord receptacle 152 for receiving electrical power for the tower assembly and two AC power convenience outlets 154. A D-type connector 156 provides access to the SCSI bus for other, external SCSI-compatible peripheral devices.

Figure 9A:
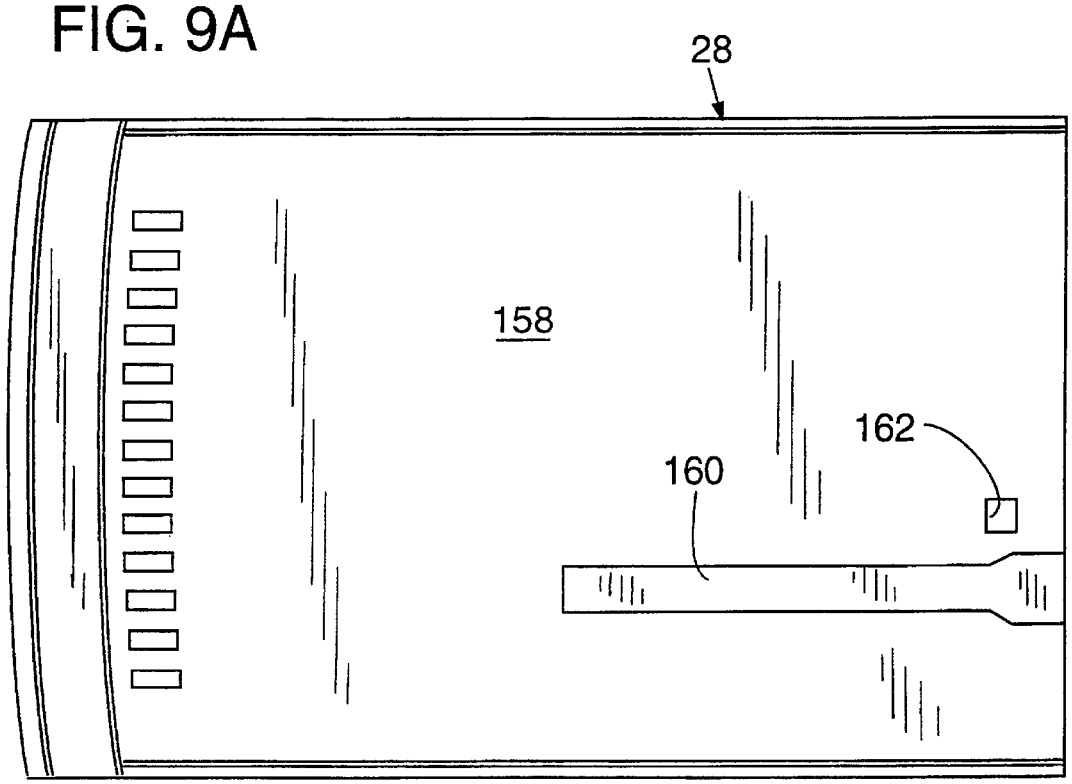

FIGS. 9A, 9B, and 9C show respective bottom, side, and rear views of a storage module of the type placed in tower assembly 10 of FIG. 1. Storage module 28 will be described as an example, and corresponding common features of all of the storage modules are designated by the same reference numerals.

With reference to FIG. 9A, storage module 28 has recessed in its bottom surface 158 a flared guide track 160 of complementary size and shape to that of guide member 74 in floor 52 of storage column element 12. A square depression 162 receives hooked end 80 of locking tab 78 when storage module 28 is properly inserted into storage column element 12. With reference to FIG. 9B, storage module 28 has on its rear surface 164 a D-type electrical connector 166 placed for spatial alignment and mating with connector 68 in rear wall 56 of storage column element 12. Multiple slits 168 provide ventilation for storage module 28. With reference to FIG. 9C, storage module 28 has recessed in its side surface 170 a flared guide track 172 of complementary size and shape to that of guide member 70 on inside surface 54 of storage column element 12. It will be appreciated that a storage module could be any one of the storage media listed in the background portion of this application or be of a nonelectronic storage device type, such as an empty container provided with no electrical connector.

FIG. 10 shows storage module 24 in position for insertion into receptacle 66 of storage column element 12 in a short stack tower assembly 10. To install storage module 24 in tower assembly 10, a user positions storage module 24 so that guide member 74 of storage column element 12 first engages and slides within guide track 160. Guide member 70 then engages and slides within guide track 172 until connectors 168 and 68 mate and hooked end 80 of locking tab 78 snaps into depression 162 of storage module 24, thereby securing it in place in tower assembly 10.

It will be obvious to those having skill in the art that many changes may be made to the details of the above-described preferred embodiment of the present invention without departing from the underlying principles thereof. The scope of the present invention should be determined, therefore, only by the following claims.

We claim:

1. A stackable modular storage tower, comprising:

a base unit including an electrical power supply and having an upper portion;

a storage column element adapted to releasably mount to the upper portion of the base unit and to receive and hold a removable storage device, the storage column element including a wall structure and a floor, the wall structure having upper and lower surfaces and first and second intersecting inner side surfaces that define a storage device receptacle having an open side region located opposite the first and second intersecting inner side surfaces, and the floor being positioned to separate the upper portion of the base unit from a storage device held by the storage column element, the floor having a support surface and an open side boundary and being positioned in contact with the first and second inner side surfaces near the lower surface of the wall structure so that the receptacle is adapted to receive a storage device of a size that extends beyond the open side boundary of the floor in a plane parallel to the support surface; and electrical connection linkage that provides electrical power from the base unit to the storage column element for delivery to a storage device held by the storage column element.

2. The storage tower of claim 1 in which the storage column element further includes a wall structure and in which each of the floor and wall structure includes a guide member to facilitate a predetermined spatial placement of a storage device in the storage column element.

3. The storage tower of claim 2 in which the guide members are of elongated shape and each of the guide members tapers outwardly at one end to provide a force fit that locks in place a storage device having a complementary guide member.

4. The storage member of claim 3 in which the guide members are protrusions from the floor and wall structure and in which the complementary guide members are slots that receive the guide members.

5. The storage tower of claim 1 in which the storage column element includes at least one manually actuatable fastener that is configured to releasably secure the storage column element to the base unit.

6. The storage tower of claim 5 in which the storage column element has upper and lower surfaces, in which the fastener is of elongated shape having a handle at one end proximal to the upper surface and a receptacle proximal to the lower surface, and in which a handle extends from the upper portion of the base unit and fits into the receptacle of the fastener to secure the storage column element to the base unit.

7. The storage tower of claim 6 in which the fastener has a longitudinal axis about which the fastener is turnable between first and second positions, in which the receptacle includes a slot that receives the handle of the base unit when the fastener is in the first position, and in which turning the fastener to the second position maintains the handle of the base unit within the receptacle of the fastener to secure the storage column element to the base unit.

8. A method of assembly of a tower of modular storage elements, comprising:

providing a storage column element having a wall structure with upper and lower column surfaces between which multiple fasteners extend in a predetermined spatial alignment, the fasteners being positionable between first and second positions and each of the fasteners having at opposite ends thereof a handle and a receptacle, the receptacle being of a shape that receives a handle when the fastener is in the first position and holds a received handle securely in place when the fastener is in the second position;

providing a base unit having an upper base surface from which multiple handles extend in a spatial alignment corresponding to the predetermined spatial alignment of the fasteners of the storage column element;

positioning the fasteners in the second position and placing the storage column element on the upper base surface of the base unit so that corresponding receptacles of the storage column element receive the handles extending from the upper base surface of the base unit; and positioning the fasteners of the storage column element to the first position to secure the storage column element and base unit together as a rigid tower assembly.

9. The method of claim 8 in which the fasteners have longitudinal axes about which the fasteners are manually turnable, and the positioning of the fasteners between the first and second positions is achieved by manually turning the handles of the fasteners.

10. The method of claim 8 in which the storage column element constitutes a first storage column element, and further comprising:

providing a second storage column element having a wall structure and fasteners of similar design and in the predetermined spatial alignment;

positioning the fasteners of the second storage column element in the second position and placing the second storage column element on the upper column surface of the first storage column element so that corresponding receptacles of the second storage column element receive the handles of the first storage column element; and positioning the fasteners of the second storage column element to the first position to secure together the first and second storage column elements.

11. The method of claim 10 in which the base unit includes an electrical power supply and the top and bottom column surfaces of each of the first and second storage column elements include complementary electrical connectors that interconnect to deliver electrical power from the base unit to the storage column elements in the tower assembly.

12. A storage column element for holding a storage device in a stackable modular storage tower, comprising:

a wall structure having upper and lower surfaces and first and second intersecting inner side surfaces that define a storage device receptacle having an open side region located opposite the first and second intersecting inner side surfaces;

a floor having a support surface and an open side boundary and being positioned in contact with the first and second inner side surfaces near the lower surface of the wall structure so that the receptacle is adapted to receive a storage device of a size that extends beyond the open side boundary of the floor in a plane parallel to the support surface;

multiple electrically interconnected connectors positioned in the wall structure, one of the connectors mounted to one of the first and second inner side surfaces; and at least one guide member extending along one of the support surface of the floor, the first inner side surface, or the second inner side surface, the guide member extending in a transverse direction to the inner side surface to which the one of the connectors is mounted, thereby to permit engagement with a complementary connector of a storage device held by the storage column element.

13. The storage column element of claim 12 in which the first inner side surface has a length, one of the connectors is mounted to the second inner side surface, and the guide member extends along the length of the first inner side surface in a transverse direction to the second inner side surface.

14. The storage column element of claim 12 in which the support surface of the floor has a length, one of the connectors is mounted to the second inner side surface, and the guide member extends along the length of the support surface of the floor in a transverse direction to the second inner surface.

15. The storage column element of claim 12 in which the one of the connectors is mounted on the inner side surface at a location closer to the support surface of the floor than to the upper surface of the wall structure.

16. The storage element of claim 12 in which a locking tab extends away from the support surface of the floor and is adapted to engage and secure in place a storage device held by the storage column element.

17. The storage element of claim 12 in which the multiple electrically interconnected connectors include first, second, and third connectors mounted to, respectively, the upper and lower surfaces and the second inner side surface of the wall structure, the first and second connectors being of respective first and second complementary mechanical designs to permit electrical connection by each of them to a connector of the respective complementary mechanical design.

18. The storage column element of claim 17 in which the electrical connection of the first, second, and third connectors includes a multiple parallel conductor flat electrical cable configured to form electrical series connection between the first and second connectors and an electrical T connection for the first and second connectors to the third connector.

19. A stackable modular storage tower, comprising:

a base unit including an electrical power supply and having an upper portion;

a storage column element adapted to releasably mount to the upper portion of the base unit and to receive and hold a removable storage device, the storage column element including a wall structure and a floor, the floor being positioned to separate the upper portion of the base unit from a storage device held by the storage column element and each of the floor and wall structure including a guide member to facilitate a predetermined spatial placement of a storage device in the storage column element; and electrical connection linkage that provides electrical power from the base unit to the storage column element for delivery to a storage device held by the storage column element.

20. The storage tower of claim 19 in which the guide members are of elongated shape and each of the guide members tapers outwardly at one end to provide a force fit that locks in place a storage device having a complementary guide member.

21. The storage member of claim 20 in which the guide members are protrusions from the floor and wall structure and in which the complementary guide members are slots that receive the guide members.

22. A stackable modular storage tower, comprising:

a base unit including an electrical power supply and having an upper portion from which a handle extends;

a storage column element adapted to releasably mount to the upper portion of the base unit and to receive and hold a removable storage device, the storage column element including a floor positioned to separate the upper portion of the base unit from a storage device held by the storage column element, at least one manually actuatable fastener that is configured to releasably secure the storage column element to the base unit, and upper and lower surfaces, the fastener being of elongated shape and having a handle at one end proximal to the upper surface and a receptacle proximal to the lower surface, and the handle that extends from the upper portion of the base unit fitting into the receptacle of the fastener to secure the storage column element to the base unit; and electrical connection linkage that provides electrical power from the base unit to the storage column element for delivery to a storage device held by the storage column element.

23. The storage tower of claim 22 in which the fastener has a longitudinal axis about which the fastener is turnable between first and second positions, in which the receptacle includes a slot that receives the handle of the base unit when the fastener is in the first position, and in which turning the fastener to the second position maintains the handle of the base unit within the receptacle of the fastener to secure the storage column element to the base unit.

* * * * *